United States Patent [19]

Cobaugh

[11] Patent Number: 4,743,081
[45] Date of Patent: May 10, 1988

[54] CONTACT ELEMENT

[75] Inventor: Robert F. Cobaugh, Elizabethtown, Pa.

[73] Assignee: AMP Incorporated, Harrisburg, Pa.

[21] Appl. No.: 20,244

[22] Filed: Feb. 27, 1987

Related U.S. Application Data

[63] Continuation of Ser. No. 381,109, May 24, 1982, abandoned.

[51] Int. Cl.<sup>4</sup> .......................................... H01R 13/428
[52] U.S. Cl. .................................... 439/751; 29/874; 439/873; 439/82
[58] Field of Search ............ 339/17 C, 220 R, 221 R, 339/221 M, 252 R, 252 P; 29/874, 882

[56] References Cited

U.S. PATENT DOCUMENTS

| | | | |
|---|---|---|---|
| 3,783,433 | 1/1974 | Kurtz et al. | 339/17 C |
| 4,066,326 | 1/1978 | Lovendusky | 339/221 M |
| 4,186,982 | 2/1980 | Cobaugh et al. | 339/17 C |
| 4,206,964 | 6/1980 | Olsson | 339/221 M |
| 4,641,514 | 2/1987 | Rozmus | 29/874 |

OTHER PUBLICATIONS

Electronic Design 26, vol. 27, Dec. 20, 1979, p. 28.

Primary Examiner—Gil Weidenfeld
Assistant Examiner—Gary F. Paumen
Attorney, Agent, or Firm—Allan B. Osborne

[57] ABSTRACT

The present invention relates to the compliant section on contact elements which are received in plated through holes in printed circuit boards and are structured to hold such elements therein without soldering. More particularly, the invention discloses an improved structure relative to the legs forming the moving members of the compliant section.

1 Claim, 1 Drawing Sheet

CONTACT ELEMENT

This application is a continuation of application Ser. No. 381,109 filed May 24, 1982, now abandoned.

There are disclosed in U.S. Pat. Nos. 3,783,433 and 4,186,982 contact elements for use as free standing posts, in card edge connectors and so forth. These contact elements include a compliant section for insertion into plated through holes in printed circuit boards. These compliant sections are so structured to yield upon being inserted into the hole in such a manner as to exert a strong force against the wall of the hole to retain the section therein but without destroying the walls and plating.

The present invention is intended to provide a contact element of the above kind which is substantially improved to yield better stability and retention forces with less hole distortion.

A contact element as defined in the first paragraph of this specification is, according to the present invention therefore, characterized in that a stabilizer section is provided immediately adjacent the compliant section and that the compliant section after being split, is spread apart and then resized or pushed back together to the final predetermined dimension.

For a better understanding of the invention reference will now be made by way of example to the accompanying drawings, in which.

Figure 4A:
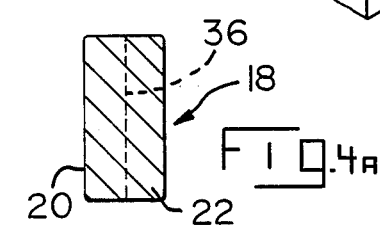
Figure 4B:
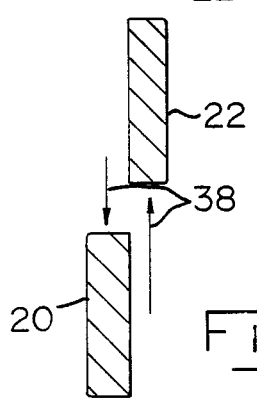
Figure 4C:
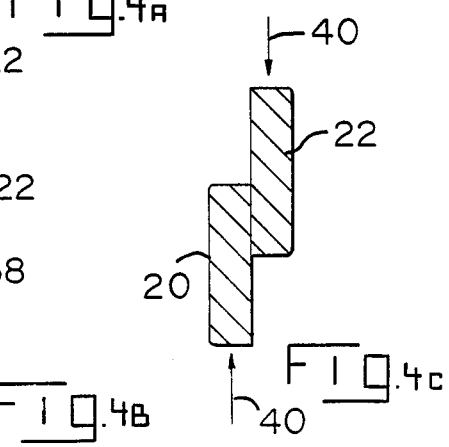

FIGS. 4a, 4b, and 4c are cross-sectional views illustrating over-forming and resizing the compliant section of the contact element in accordance with the present invention.

Figure 1:
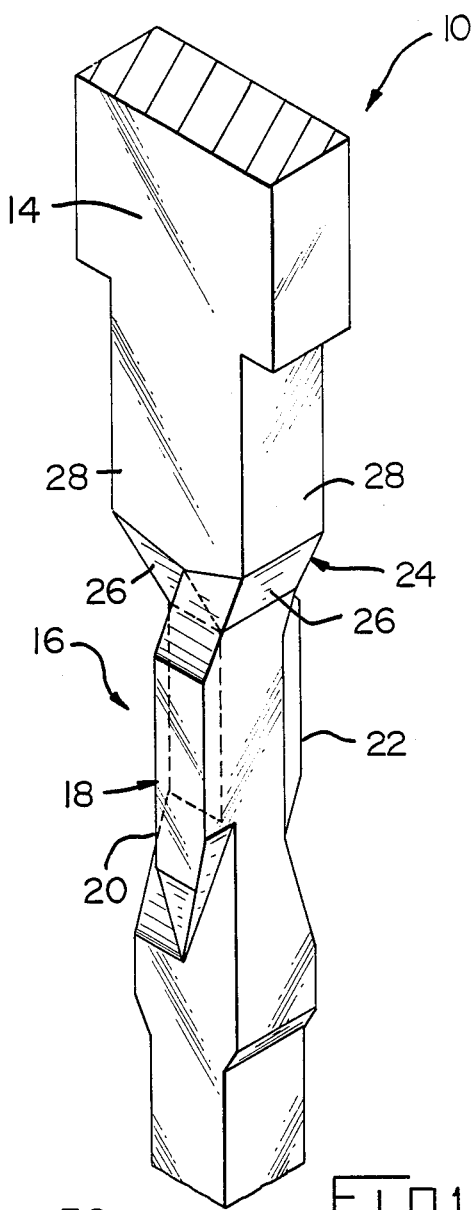
FIG. 1 is an isometric view of a portion of a contact element including the compliant section and the stabilizer section added thereto in accordance with the present invention.

With reference to FIG. 1, contact element 10 includes a lower section 12 which may be a post extending below a circuit board for wire wrapping or like purposes. Further, the element includes an upper section 14, of which only a small portion is shown, which may be a wire-wrap post, a spring-contact section for use in a card edge connector (not shown) or some other similar structure.

The compliant is in between the aforementioned sections and is indicated generally by reference numeral 16. For a complete description of the compliant section, inquiry may be made to U.S. Pat. No. 4,186,982, which is incorporated herein by reference. Generally, the compliant section includes a split portion 18, the split defining two legs 20 and 22. The legs are offset with respect to each other along the shear plane provided by the splitting.

The stabilizer section of the present invention is located immediately above compliant section 16 and is indicated by reference numeral 24. The section includes opposing beveled or radiused surfaces 26 and sides 28 up to shoulders 30. Note that the stabilizer section is parallel to the shear plane separating legs 20 and 22. In other words, the beveled surfaces are rotated ninety degrees relative to the direction in which the legs move.

The critical dimension of the stabilizer section is the length of a diagonal line between opposing corners on sides 28. Ideally, that dimension will be equal to the diameter of the smallest or minimum plated through hole on a circuit board; i.e., the specified hole diameter less the permitted tolerance.

Figure 2:
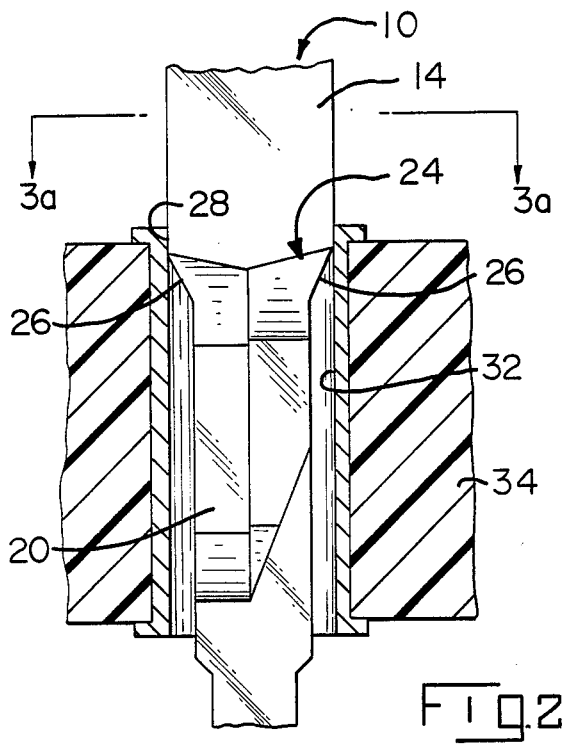
FIG. 2 is a cross-sectional view of a plated through hole in a printed circuit board showing the compliant section of FIG. 1 positioned therein.
Figure 3A:
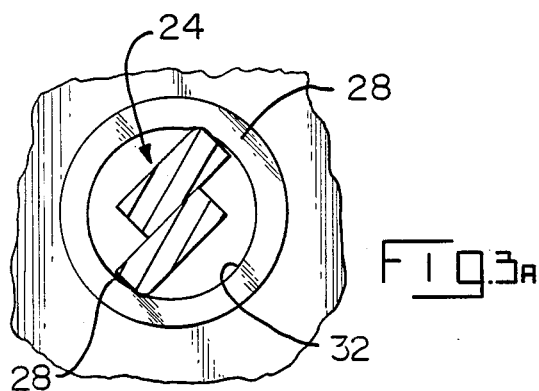
FIGS. 3a and 3b are views taken along lines 3—3 of FIG. 2.
Figure 3B:
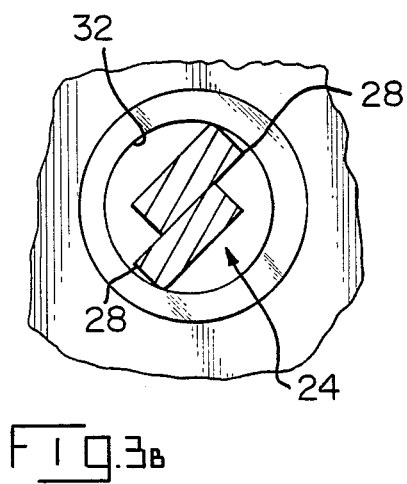

FIG. 2 shows the compliant and stabilizer sections positioned in plated through hole 32 in circuit board 34. The drawing shows stabilizer section 24 engaging the wall of the plated through hole adjacent the top surface of board 34. The beveled surfaces 26 facilitates the insertion particularly where hole 32 is undersized; i.e., of a minimum diameter. In this case, the beveled surfaces and sides 28 will displace some of the plating as shown in FIG. 3a. In extreme cases, the hole may be slightly distorted. Should the diameter of hole 32 be at a maximum diameter, sides 28 will just bear against the wall without disturbing the plating. This case is shown in FIG. 3b.

A second improvement to contact element 10 involves compliant section 18. The improvement provides pre-stressing legs 20 and 22 by pushing them apart and then pushing them back towards each other to the desired size. FIGS. 4a, 4b, and 4c illustrate the aforementioned improvement. FIG. 4a shows the compliant section with a dashed line 36 being the slit forming legs 20 and 22. Thereafter, the legs are pushed apart in the direction of arrows 38 in FIG. 4b and along the shear plane. The separation is preferably complete; i.e., the legs are completely separated one from the other. Lastly, the legs are pushed back towards each other as indicated by arrows 40 in FIG. 4c; i.e., the legs are resized to a predetermined dimension.

The aforementioned improvement has provided substantially lower hole distortion and a significant decrease in force required to drive the contact element into the hole. Further, with the force required to insert a compliant section with resized legs being reduced the vulnerability of the contact elements to buckling is much less.

Tests show that the force required to push an element out of a plated through hole is not measurably significant for a resized compliant section than for an element without this improvement.

Further, tests have shown that the stabilizer section is very effective in returning the contact element to a vertical position after a deforming load was removed from an end. Also, the degree of movement did not increase over time during tests which subjected the elements to deforming loads in various directions. This indicates that the stabilizer section prevents cumulative loss in stability from multiple disturbances.

In summary, tests clearly indicate that contact elements incorporating the novel improvements disclosed herein cause less hole distortion, locks the elements in the hole as securely as for non-improved elements and has greater stability against deforming horizontal loads.

I claim:

1. A contact element of the type having a compliant section consisting of two sheared apart legs extending along a longitudinal axis, characterized in that the legs are pre-stressed by being initially spread apart in opposite directions along the shear plane and then pushed back towards each other along the same shear plane to a predetermined relative position prior to insertion into a hole in a printed circuit board or the like.

* * * * *